United States Patent [19]
Herbst

[11] Patent Number: 5,894,006
[45] Date of Patent: Apr. 13, 1999

[54] METHOD FOR PRODUCING PLASTIC MATERIAL OBJECTS

[76] Inventor: Richard Herbst, Freisinger Strasse 3b, D-85386 Eching, Germany

[21] Appl. No.: 08/656,388

[22] Filed: May 31, 1996

[30] Foreign Application Priority Data

May 31, 1995 [DE] Germany .................. 195 19 901

[51] Int. Cl.⁶ .......................... B29C 45/14; B29C 70/70
[52] U.S. Cl. ................... 264/132; 264/263; 264/266; 264/267; 264/272.17; 264/275
[58] Field of Search ........................ 264/250, 261, 264/263, 265, 267, 271.1, 275, 266, 272.15, 272.17, 278, 132

[56] References Cited

U.S. PATENT DOCUMENTS

| | | | |
|---|---|---|---|
| 3,235,954 | 2/1966 | Fromson | 264/266 |
| 4,427,615 | 1/1984 | Eskesen | 264/278 |
| 4,961,893 | 10/1990 | Rose | 264/272.17 |
| 5,000,903 | 3/1991 | Matzinger et al. | 264/267 |
| 5,030,407 | 7/1991 | Mollet et al. | 264/261 |
| 5,134,773 | 8/1992 | LeMaire et al. | 264/272.17 |
| 5,350,553 | 9/1994 | Glaser et al. | 264/132 |
| 5,387,306 | 2/1995 | Jarvis | 264/272.15 |
| 5,509,990 | 4/1996 | Masui et al. | 264/266 |
| 5,635,129 | 6/1997 | Breezer et al. | 264/511 |

FOREIGN PATENT DOCUMENTS

0399868B1 10/1994 European Pat. Off. .

*Primary Examiner*—Angela Ortiz
*Attorney, Agent, or Firm*—Knobbe Martens Olson & Bear

[57] ABSTRACT

A method and a semi-finished article for producing plastic material objects, in particular smart cards, are disclosed. At least two surfaces of the object are constituted by films, preferably by labels. The labels are applied to surfaces of a cavity in a mold of a plastic material injection molding machine. The cavity is then filled by injecting molten plastic material. The labels are connected one to the other prior to being introduced into the cavity.

11 Claims, 14 Drawing Sheets

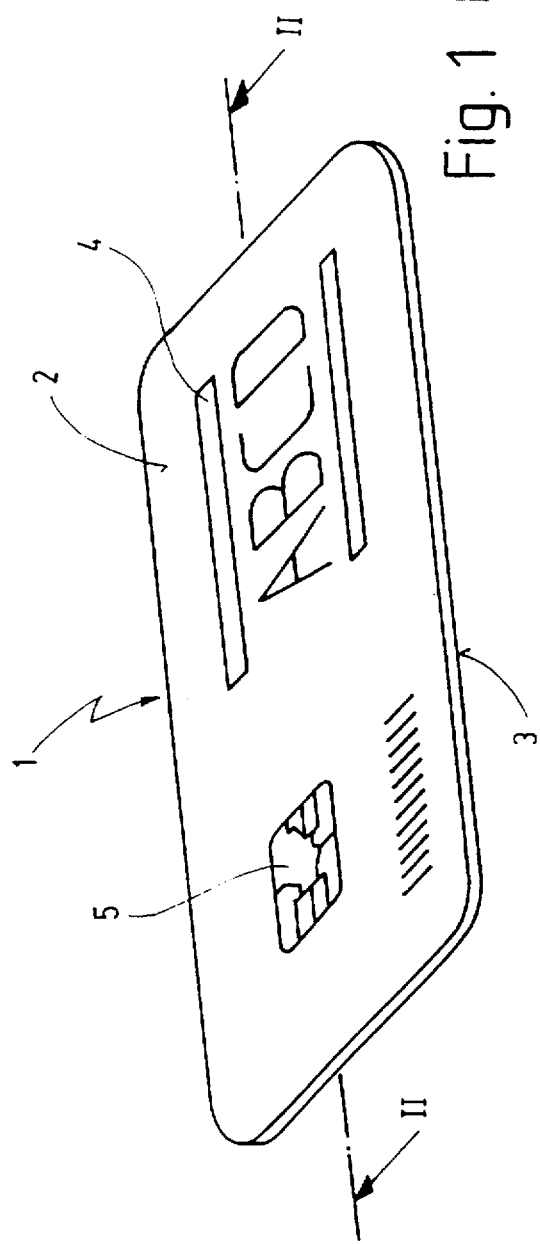
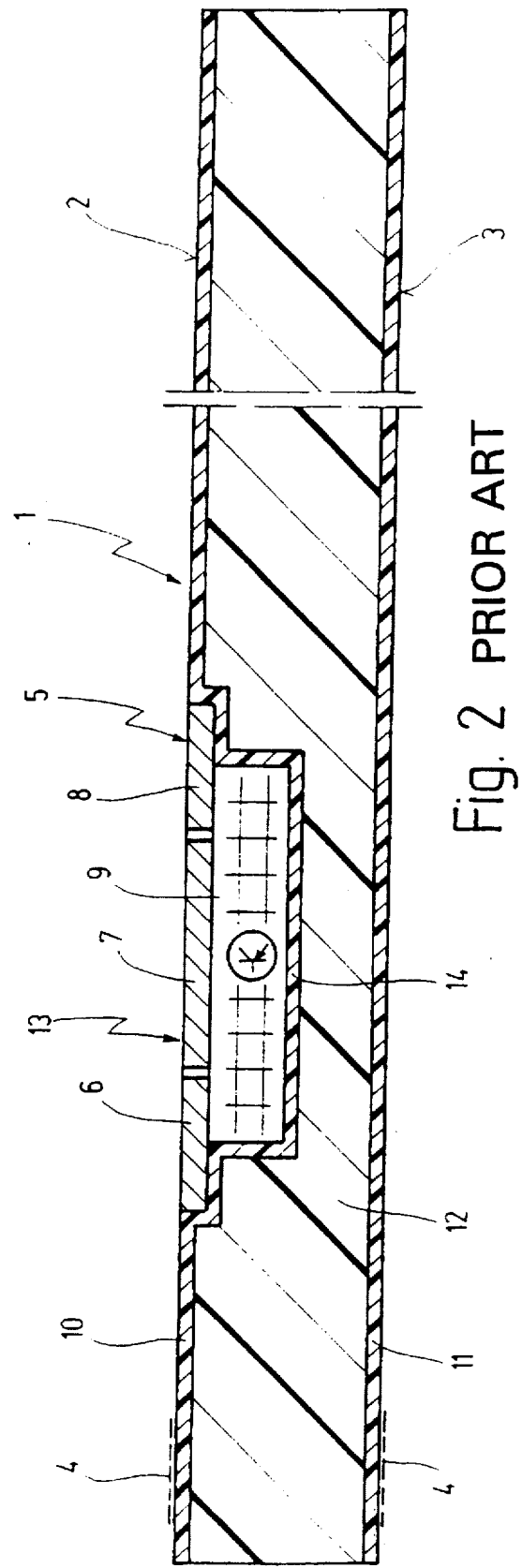
Fig. 1 PRIOR ART
Fig. 2 PRIOR ART

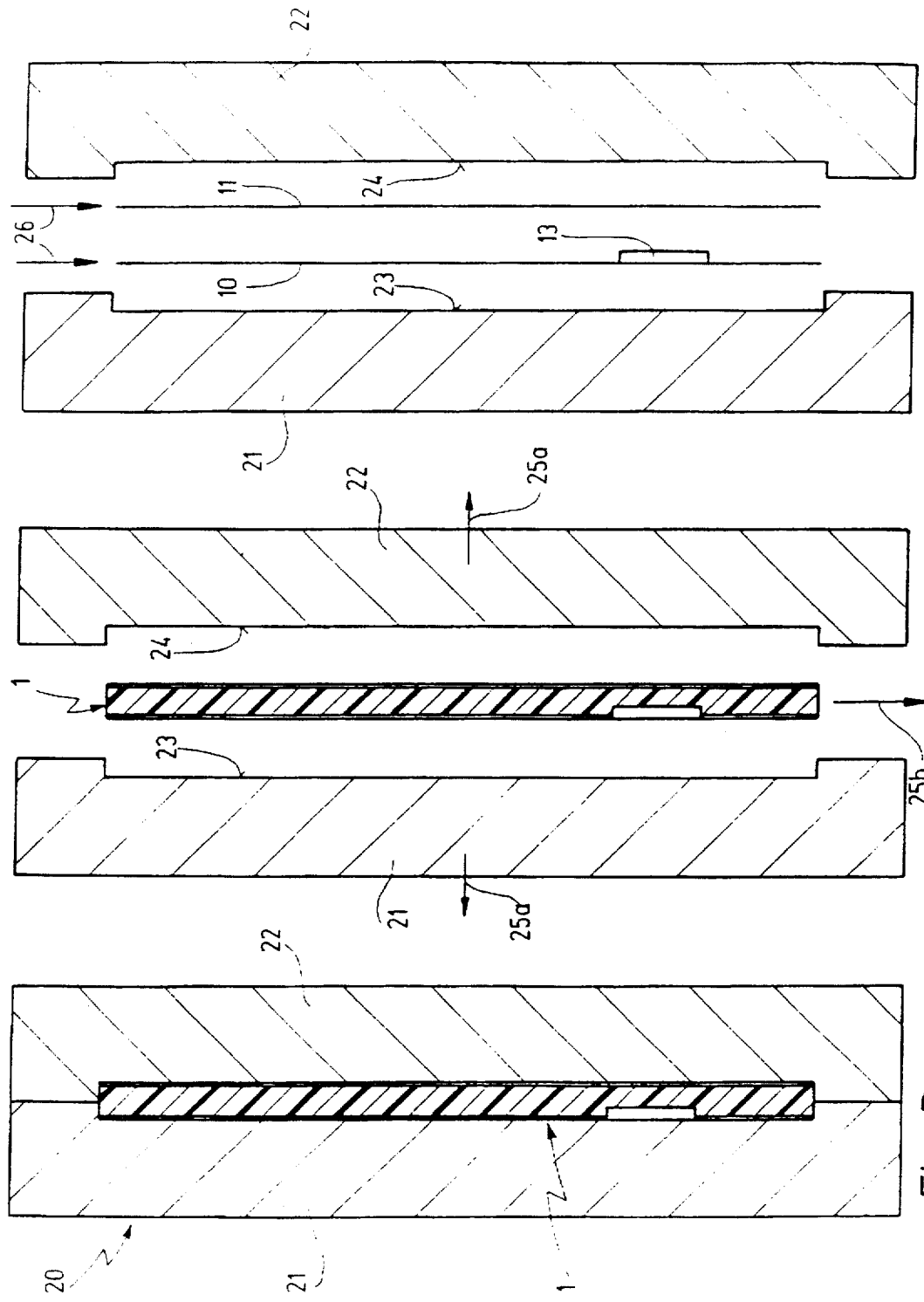

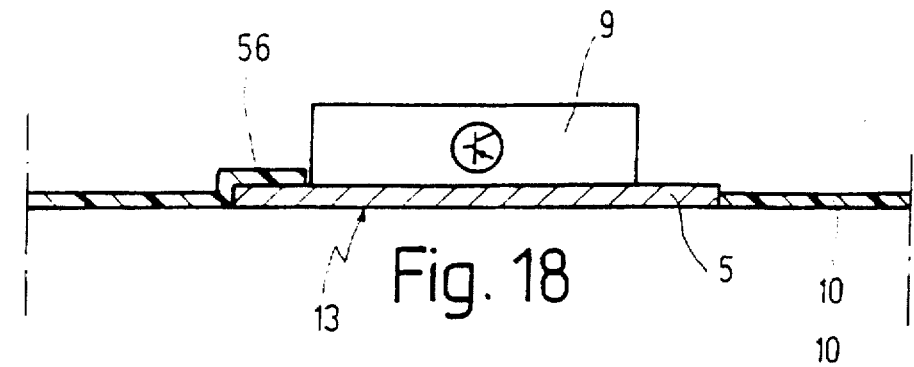
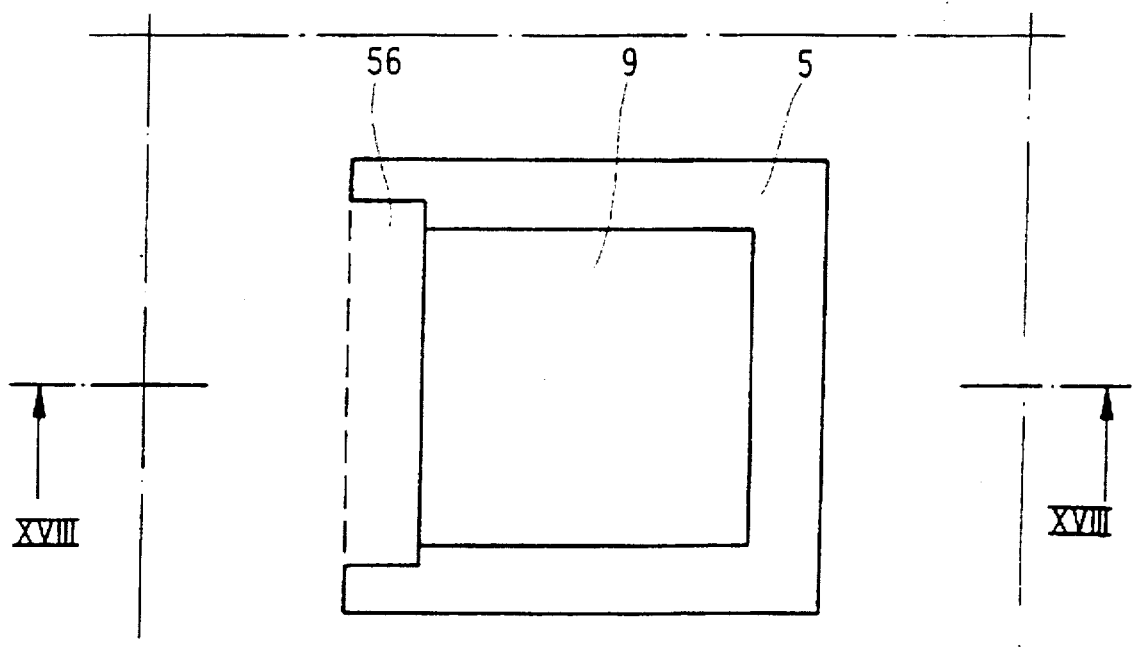
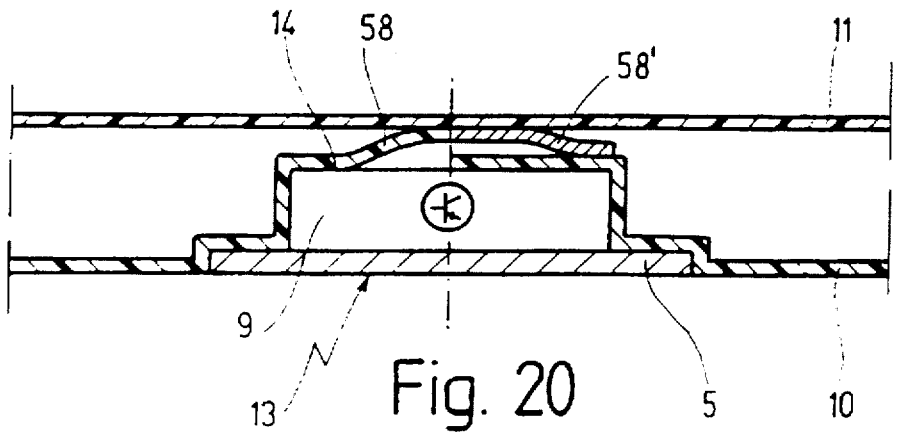

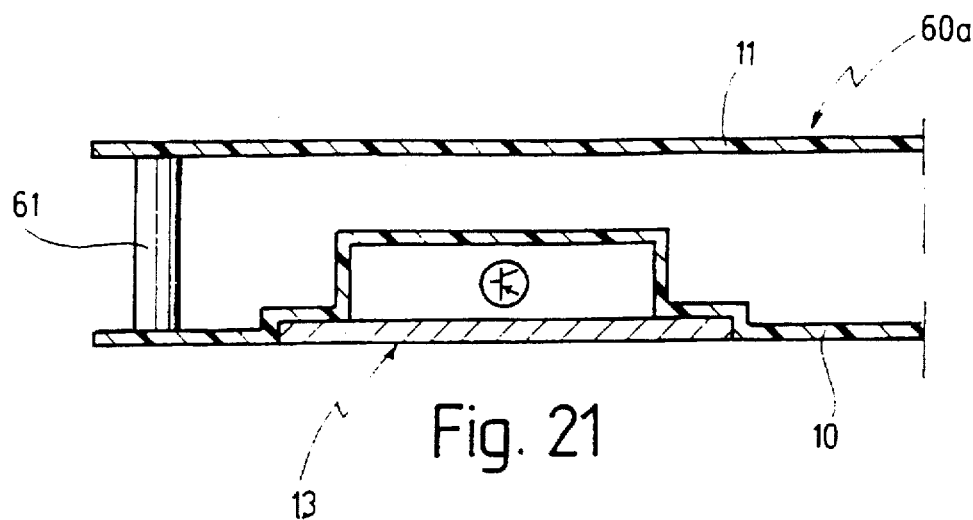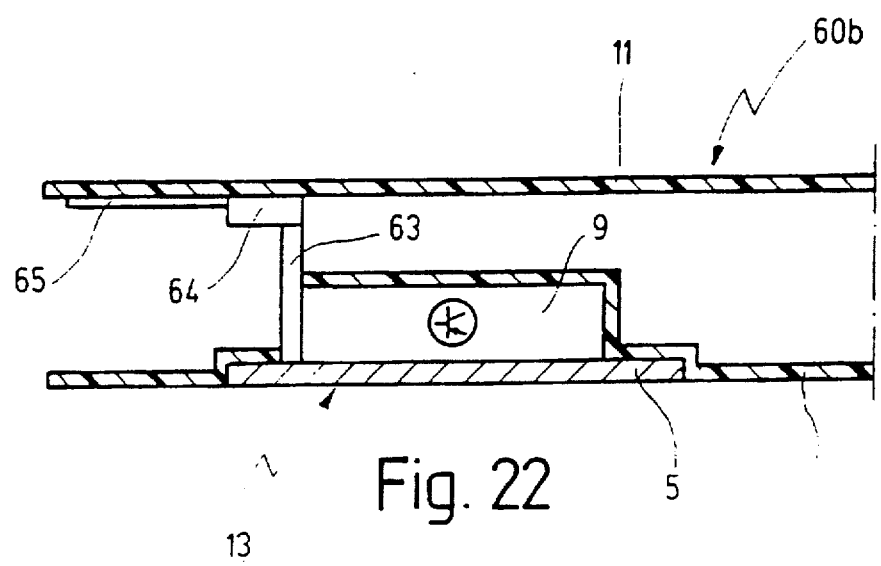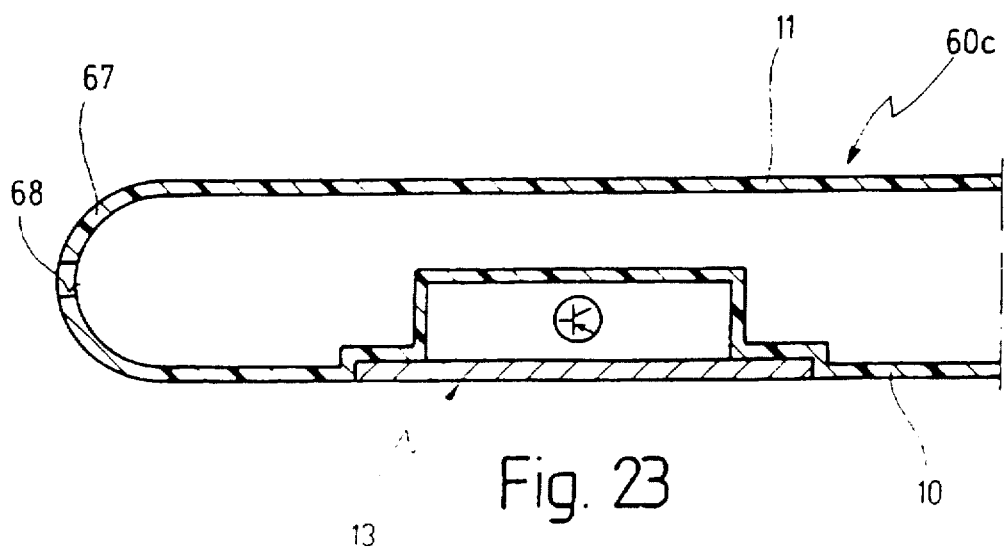

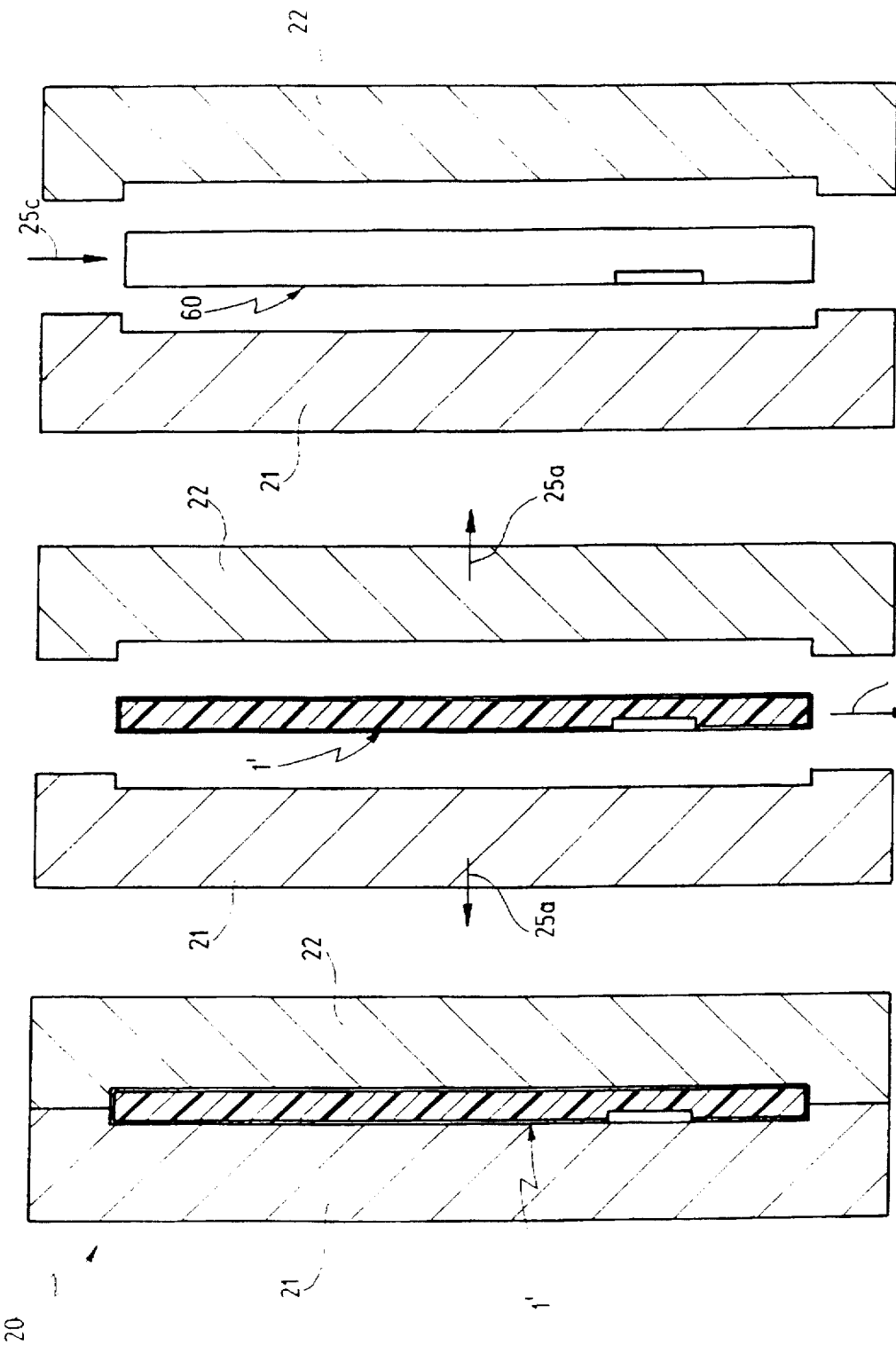

METHOD FOR PRODUCING PLASTIC MATERIAL OBJECTS

FIELD OF THE INVENTION

The present invention relates to the field of plastic material injection molding. More specifically, the invention relates to a method for producing plastic material objects, in particular smart cards. The invention, further, is related to a semi-finished article for the production of plastic material objects.

Cross-reference is made to parallel patent applications "Method and apparatus for producing a smart card" U.S. Ser. No. 08/656,356 and "A method for producing plastic material objects" U.S. Ser. No. 08/656,560 of the same applicant and filed on the same day as the present application.

BACKGROUND OF THE INVENTION

The term smart card is used to describe a plastic card with one or two laminated sides, which usually carry some instructions and/or advertising printed thereon and/or certain safety features, for example a hologram, a magnetic strip, a photo of the card holder, or the like. A sort of module is embedded in the smart card. The module consists of an integrated semiconductor electronic circuit (chip) and, usually, of a contact-and-carrier plate carrying the chip. In the case of some cards, the wafer coacts with a plurality of surface segments to form electric contacts that are accessible from the outside. In the case of other cards, antennas are provided in the card for the non-contact exchange of information, for example of data. Smart cards of that kind are employed as telephone cards, authentication cards for mobile communications equipment, as check cards for money movements, as authorization cards for medical insurance schemes or the like, as right-of-access cards for buildings or parts of buildings, and for other purposes, such as the protection of goods. The user then introduces the smart card into, or moves it past, a card reader which thereby enters into communication with the electronic chip in the smart card via, corresponding contacts or antenna means. In the case of a telephone card or a check card, for example, it is then possible in this way to check the credit balance on an account, to determine the identity of a person or to exchange other data.

In order to enable smart cards to be simultaneously used as advertising vehicle, the smart cards preferably are produced in such a way that one or two films, preferably so-called labels, are employed to form one or both flat sides of the finished smart card. In this connection the term label is understood to describe a film with, preferably, one printed side. The label carries the advertising imprint, or the like. The imprint must be of high quality. It has been found that improved quality is achieved for the imprint when the film forming the label is printed before the smart card is produced.

For producing the smart card the label is introduced into the cavity of a plastic injection mold. For this purpose, the cavity exhibits a flat, cuboid shape, and the labels are placed on the flat surfaces of the cavity. It must be ensured in this connection that the labels are precisely positioned in the cavity and pressed against the surfaces of the cavity in order to allow the injection-molding process to be carried out smoothly.

Preferably, the same or a similar plastic material, such as polystyrene, propylene, ABS or polycarbonate, are used for the film of the label and the plastic material to be injected so as to ensure that an especially strong bond is achieved between the labels and the injected plastic material.

In this connection, the term "label" is used by way of example only. Generally speaking, both pre-cut and uncut films may be used within the scope of the present invention. The films may carry an imprint on one or both sides. They may be arranged on one or on more surfaces of the object, for example the smart card. In addition, other materials, such as transfer labels or transfer films may also be employed. The latter are provided with an imprint that is transferred to the object during the injection-molding process. After completion of the injection-molding process, the film is then removed and disposed of. Accordingly, films or labels may be used on one or more surfaces, or alternately with transfer labels or transfer films, or the latter may be used exclusively. And all these materials may be employed in pre-cut condition, or drawn off the roll.

The plastic material is conventionally injected into the cavity between the two labels through a feed slot provided in the area of one narrow end of the cavity.

Regarding the cross-section of the smart card, the rear surface is then formed by one of the labels. The front face, i.e. the view surface, comprises the contact and carrier wafer with the chip arranged behind it.

A method for producing a smart card has been known from EP-B1-0 399 868. In the case of this known method, the chip is at first mounted and wired on a metal strip, and is then embedded, together with the metal strip, in a plastic material so that one obtains a module which already exhibits a certain thickness. The module is configured in such a way that its thickness corresponds to the height of the cavity in the mold. Thus, when the mold is closed, a certain pressure is exerted upon the module whereby the latter is fixed in the cavity in a given position. Instead of using a pre-printed label, some embodiments of the known method make use of a picture-transfer film that is introduced into the mold cavity. The picture on the transfer film comes to adhere to the injected plastic material. After removal of the smart card from the mold, the imprint then remains of the plastic body, which does not contain any label, and the transfer film can be removed. According to certain variants of this production method, one or both flat sides of the smart card may be provided with an imprint with the aid of such films. On the other hand, the use of labels on one or both flat sides is likewise possible according to the known method. Since the known method provides that when labels are used the module is arranged on the inside of the label, the latter is cut out in the area of contact of the module so that the contacts of the module can be accessed from the flat side of the finished smart card.

It is a disadvantage of the known method that the proper positioning of the module in the mold cavity can be guaranteed only with difficulty. Specifically, the contact pressure required for fixing the module inside the cavity is produced only after closing of the mold so that there is a risk that the module may get displaced during the closing process of the mold.

Another disadvantage of the known method lies in the fact that when two labels and/or picture transfer films are used, two separate elements have to be introduced into the mold cavity. As the edges of smart cards have a length of a few centimeters only, the labels and/or the picture transfer films are relatively soft and instable because the label or films are extremely thin. Precise handling and positioning is difficult. This is true in particular when short cycle times are to be achieved, which are of course connected with rapid traveling speeds, accelerations and decelerations of the handling unit. Due to the resulting inertia forces, the relatively soft and instable labels and/or transfer films may then bend, fold over, or the like, so that there is a risk that an excessive percentage of waste may be produced.

Another disadvantage of the known method lies in the fact that after removal of the smart card from the mold, the material still has to be separated in the sprue area. The feed slot gives rise to a so-called film sprue that must be cut off after removal of the smart card from the mold. However, if such as sprue has to be cut off, there is always the risk that an inaccurate cutting line may be obtained which is extremely undesirable for the users of smart cards.

The invention claimed within the scope of the application also relates to plastic objects generally, to the extent comparable problems are encountered, even if this may not be specifically described herein by way of specific embodiments of the invention.

For example, it has been known in the production of plastic containers, i.e. small boxes, bowls or the like, or lids or inserts for such containers, to provide one side of such objects with a lamination. The respective side may be flat, dished, or bent in cylindrical shape. The lamination, which may, for example, contain an advertising imprint or instructions for use, may in this case likewise be formed by a label, i.e. an embedded plastic film.

Comparable problems are encountered also with plastic objects where mechanical, especially metallic objects are embedded by the injection-molding process, such as fasteners, reinforcing elements, hinges or electric/electronic elements, such as antennas, screenings, or the like.

In addition, it is generally a problem connected with the production of plastic objects by the injection-molding process that the indispensable gate points should be invisible on the finished product, if possible.

Now, it is the object of the present invention to improve a method and a semi-finished product of the beforementioned kind in such a way that the described disadvantages are avoided. Specifically, the aim is to facilitate the inserting operation and to achieve shorter cycle times by avoiding the disadvantages connected with the rapid handling of soft, inelastic objects, specifically labels.

SUMMARY OF THE INVENTION

Essentially, the invention encompasses a method for producing plastic material objects having at least two flat surfaces, the surfaces being constituted by a first film and a second film, respectively, the method comprises the steps of:

providing the first and the second film with the films being connected one to the other;

inserting the connected films into a cavity in a mold of a plastic material injection molding machine, the cavity defining a hollow space being shaped as the object and having a first and a second flat surface;

affixing the first and the second film to the first and the second cavity surface, respectively;

injecting molten plastic material into the cavity;

allowing the plastic material to solidify; and ejecting the solidified plastic material with the first and the second film thereon constituting the object flat surfaces.

The invention, further, encompasses a semi-finished article for the production of plastic material objects by injection-molding, the object having at least two flat surfaces being constituted by at least two films, wherein the at least two films are connected one to the other.

The invention makes use for this purpose of an artifice in that it combines two elements, each being soft and instable in itself, to form a compound structure, i.e. a so-called sandwich. The rigidity and, thus, the handling properties at high speeds, accelerations and decelerations are much better with such a sandwich than would be the case with a single element, for example a label.

The two films of the sandwich being arranged at different levels, the sandwich always exhibits a three-dimensional structure with corners, edges, or bends that impart increased rigidity to the sandwich. Consequently, the speed and/or acceleration or deceleration at which such a sandwich can be handled may be higher by at least one order of magnitude. And the cycle times for the production of plastic objects, for example the smart card, can be reduced correspondingly. This leads to enormous economic advantages, because the capacity of the very complex and expensive production equipment can be utilized to a considerably higher degree.

By employing different materials it is possible to produce a sandwich structure with very specific advantages, such as increased rigidity/strength by the use of films with a higher modulus of elasticity;

use of a plastic material with an expanding agent in its core, with the resulting possibility, for example, to embed the chips in a softer environment, i.e. to reduce the risk of breakage; soft and elastic behavior;

improved scratch resistance of the card by the use of a particularly scratch-resistant film;

electric screening by the use of an electrically conductive film on one side in the case of housing parts for electrotechnical components; and improved service life of foodstuff containers by the use of films of reduced permeability, for example for oxygen, as barrier sheets.

According to certain preferred embodiments of the invention, the at least one film is a label or a carrier film or a picture transfer film, there being also the possibility to use these variants in different combinations.

According to a preferred further development of the invention, the films are connected one with the other by means of connection elements.

This feature provides the advantage that the sandwich can be implemented with a broad range of different structures. The shape and physical properties of the connection elements can be varied depending on the particular application. For example, the connection elements used may be of a kind that dissolves in the liquid plastic material as the latter is being injected.

According to a preferred further development of an embodiment of this kind, the connection elements permit an electric connection to be established between the labels.

This feature provides the advantage that the electric/electronic functions can be distributed over both films. It is then possible, for example, to equip one of the films with a so-called module, i.e. an element comprising an electric chip and a contact and carrier wafer, while the other film is equipped with an antenna, for example.

According to other embodiments of the invention, the films are designed as one piece, and are interconnected by an arc-shaped section.

This feature provides the advantage to simplify the production of the sandwich because it eliminates the need to join separate elements.

According to a preferred further development of that variant, the films are produced from a single blank by folding.

This feature provides the advantage that the production of the sandwich is rendered particularly easy. The necessary blanks can be produced in large quantities and at low cost by a punching process and can then be folded by means of known equipment. i.e. transformed into mechanically stable structures. in various ways.

It is. for example. possible in this connection to use a blank with tongues that are separated from the remaining blank by perforations which are then cut off during injection of the plastic material.

This feature provides the advantage that the tongues may be used as aids for handling and positioning the sandwich.

This is true in particular when the tongues are provided with register holes by means of which the films can be fixed in the mold and/or when the tongues are positioned outside the cavity in the closed condition of the mold.

These features provide the advantage that the elements to be cut off later. i.e. the tongues. offer the designer great freedom in implementing suitable measures for guaranteeing the precise positioning of the sandwich inside the mold cavity.

It has been mentioned before that the method is preferably used for producing smart card where a module comprising a chip and a carrier and contact wafer is mounted on a label. Preferably. the module is fastened in a predetermined position on the one film. before the latter is introduced into the cavity. and is then placed in the cavity together with the film as a single unit.

This feature provides the advantage that the proper positioning of the module on the film and. thus. in the cavity can be guaranteed.

Other advantages will be apparent from the specification and the attached drawing. It is understood that the features mentioned above and those yet to be explained below can be utilized not only in the respective combinations indicated, but also in other combinations or in isolation. without leaving the scope of the present invention.

BRIEF DESCRIPTION OF THE DRAWINGS

The invention will be described in more detail and explained below with reference to certain embodiments. in conjunction with the attached drawings in which:

FIG. 1 shows a diagrammatic representation of a smart card;

FIG. 2 shows a grossly enlarged cross-section through the smart card according to FIG. 1. taken along line II—II;

FIG. 3 shows a diagrammatic view of a plastic injection mold with two halves. of the type that may be used for the production of smart cards according to FIG. 1. in a first operating phase;

FIG. 4 shows a representation similar to that of FIG. 3. but illustrating a second operating phase of the plastic injection mold;

FIG. 5 shows a representation similar to that of FIG. 3. but illustrating a third operating phase of the plastic injection mold;

FIG. 18 shows a representation similar to that of FIG. 12. but illustrating an eighth embodiment of a mounting method. cut along line XVIII—XVIII in FIG. 19;

FIG. 19 shows a top view of an arrangement according to FIG. 18;

FIG. 20 shows a representation similar to that of FIG. 12. but illustrating two variants of a tenth embodiment of a mounting method;

FIG. 21 shows a representation similar to that of FIG. 12. illustrating a first embodiment of a sandwich formed from two labels;

FIG. 22 shows a representation similar to that of FIG. 21. but illustrating a second embodiment of a sandwich;

FIG. 23 shows a representation similar to that of FIG. 21. but illustrating a third embodiment of a sandwich;

FIG. 26 shows a representation similar to that of FIG. 3. illustrating a production method for a smart card. using a sandwich in a plastic injection mold. during a first operating phase;

FIG. 27 shows a representation similar to that of FIG. 26. but illustrating a second operating phase of the plastic injection mold;

FIG. 28 shows a representation similar to that of FIG. 26. but illustrating a third operating phase of the plastic injection mold;

DETAILED DESCRIPTION OF THE PREFERRED EMBODIMENTS

Figures 6, 7, 8:
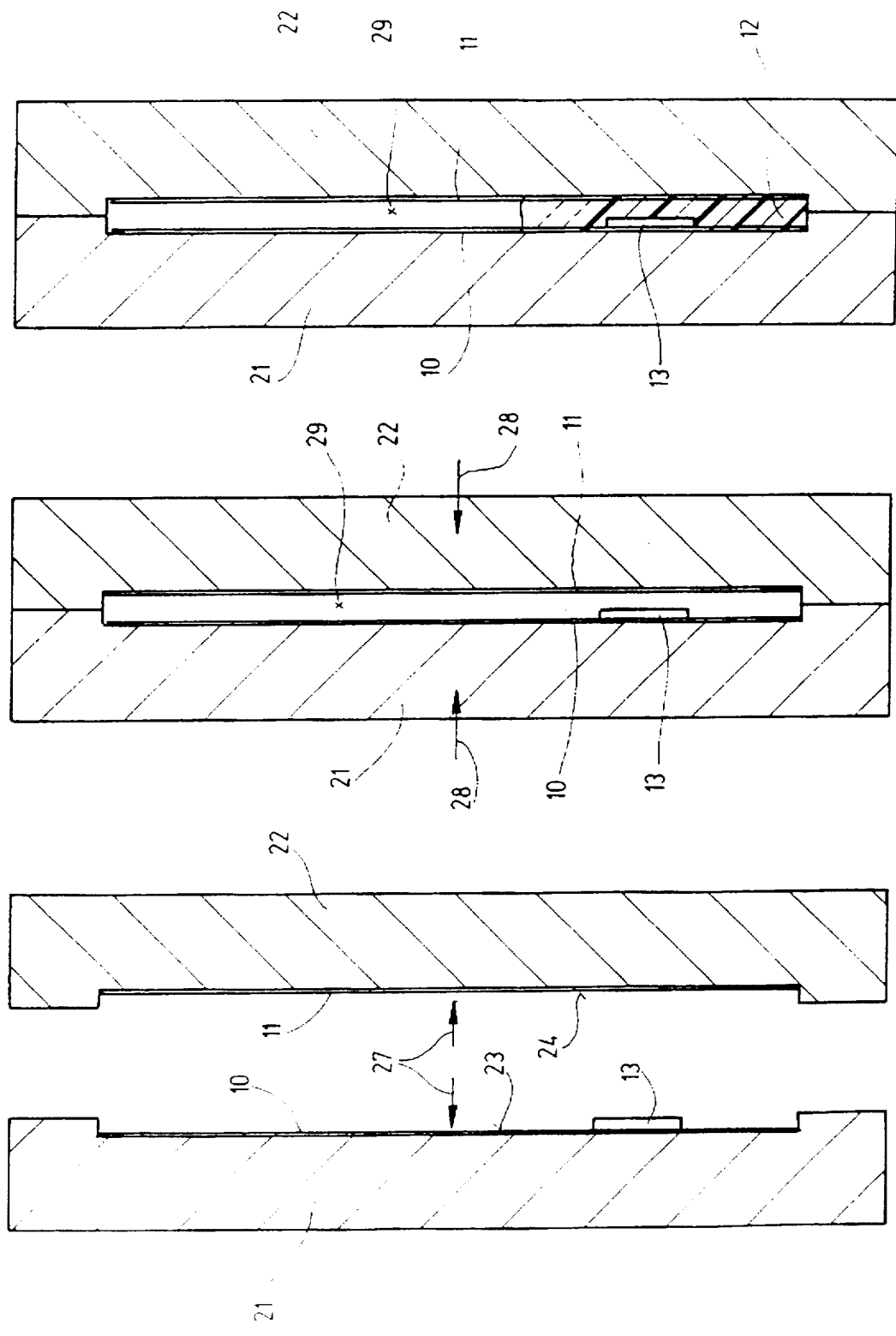
FIG. 6 shows a representation similar to that of FIG. 3. but illustrating a fourth operating phase of the plastic injection mold.
FIG. 7 shows a representation similar to that of FIG. 3. but illustrating a fifth operating phase of the plastic injection mold.
FIG. 8 shows a representation similar to that of FIG. 3. but illustrating a sixth operating phase of the plastic injection mold.

In FIG. 1, a structure known as smart card is generally designated by reference numeral 1. This term is used to describe a plastic card, usually provided with printed instructions and/or an advertising imprint, holograms, magnetic strips, safety features, or the like. Embedded in the smart card is an electronic chip that can be accessed from the outside via electronic contacts or an antenna. Smart cards of this kind are widely used as telephone cards, authentication cards for mobile communications equipment, as check cards for money movements, as authorization cards for medical insurance schemes or the like or as right-of-access cards for buildings or parts of buildings. The user introduces the smart card into a card reader which thereby enters into communication with the electronic chip in the smart card, via corresponding contact means. It is then possible in this way to check the credit balance on an account, to determine the identity of a person or to exchange other data.

The smart card 1 carries an imprint 4 on its upper surface 2 and/or its lower surface 3. The imprint 4 may consist of an advertising imprint or of instructions for use of the smart card 1. An extremely good reproduction quality is required for the imprint 4, especially if it contains advertising imprints or holograms.

A carrier and contact wafer 5 is embedded to extend flush with the upper surface 2 of the smart card 1.

FIG. 2 shows a grossly enlarged diagrammatic representation cut along line II—II in FIG. 1, illustrating further structural details.

It can be seen that the carrier and contact wafer 5 is subdivided into a plurality of contact zones 6, 7 and 8. The contact zones 6 to 8 are connected, in a manner not shown in detail, to terminals of a chip 9, i.e. an electronic circuit. It is thus possible to exchange data with the chip 9 from the outside, via the contact zones 6 to 8, unless an antenna is provided to permit non-contact data exchange.

The upper surface 2 and/or the lower surface 3 of the smart card 1 are constituted by so-called labels 10 and 11. The term label is used to describe a plastic film with, preferably, one printed side. The labels 10, 11 consist for example of polystyrene, propylene, ABS or plycarbonate.

An injected plastic material 12, consisting preferably of a plastic material identical or similar to the plastic material of the label 10, 11, is present between the labels 10, 11—or if a label is provided on one side only, under the latter—so that the plastic materials will form an intimate bond during the production process of the smart card 1.

While the above description of the embodiment of FIGS. 1 and 2 refers exclusively to "labels", it is understood that instead of a pre-cut plastic film any film may be used either in the form of pre-cut pieces or in the form of an endless web. And both the labels and, generally speaking, the film may be printed on one or on both sides. In the case of certain embodiments of the invention, the labels or the film, especially the endless film, take the form of picture transfer labels and/or picture transfer film. During the injection-molding process, the picture transfer label and/or the picture transfer film constitute the outer boundaries of the smart card. The imprint, if any, present on the film or label is then transferred to the injected plastic material during the injection-molding process. Upon completion of that process, the transfer label and/or the transfer film is removed again so that the finished smart card consists exclusively of the molded plastic body. The flat upper surface and/or the flat lower surface are not covered by any label or any other piece of film in the case of these embodiments of the invention. Only the imprint, for example a picture, has been transferred to the injected plastic material from the label and/or the transfer film. The transfer label or the transfer film as such is removed separately and discarded after molding of the smart card.

It is thus possible, according to the present invention, to apply labels or other plastic films on the surface of interest of the object, or on several surfaces of interest, or alternatively to transfer only an imprint to one or more of the said surfaces by means of a transfer label or a transfer film. And there is a wide range of possibilities to make use as film or labels of the most various materials or semi-finished products. The labels or films may consist of the before-mentioned materials. Further, the use of hot-stamping films is also possible. The labels or films may be processed in the form of pre-cut elements or off the roll.

Accordingly, when the term "label" is used in the description of the embodiments of the invention, this term is to be understood as an example only, there being always the possibility, in all described embodiments, to make use also of the before-mentioned other alternatives.

In FIG. 2 it can be clearly seen that the module 13 of that embodiment, formed by the carrier and contact wafer 5 and the chip 9, is covered by an enclosure 14 formed in this case by a section of the upper label 10 that tightly surrounds the module 13.

According to FIGS. 1 and 2, the smart card 1 is produced by a plastic injection-molding process. This will now be described by way of a first embodiment of the invention with reference to FIGS. 3 to 8:

FIG. 3 shows a very diagrammatic representation of a plastic injection mold 20 consisting of a first, left mold half 21 and a second, right mold half 22. The associated means for opening and closing the mold 20, as well as the means for feeding the plastic material 12 and for removing and/or inserting the plastic elements, have been omitted for the sake of clarity.

From FIG. 3 it is apparent that a smart card 1, produced by a preceding production cycle, is present in the mold 20.

The mold 20 is now opened by moving the mold halves 21, 22 in laterally outward direction, as indicated by arrows 25A. In this open position, the cavities 23 and 24 in the mold halves 21 and 22 can be clearly seen. It should be noted once more at this point that the representation shown is to be understood as an example only. It would be equally possible, for example, to design the mold cavities 23 and 24 as a single mold cavity provided in one of the two mold halves, in which case the other mold half would be flat at the respective contact surface.

An arrow 25B indicates that the smart card 1 can be removed from the tool 20 in the open condition of the latter, as illustrated in FIG. 4, for example in downward direction, as indicated in FIG. 4.

As shown in FIG. 5, the two labels 10 and 11 can now be introduced from above, in the direction of the arrows 26. But of course it would also be possible to introduce them from below or from the side. The label 10 already carries the module 13. The module 13 has been mounted on the label 10 in advance, in the manner that will be described in more detail further below.

As shown in FIG. 6, the two labels 10 and 11 are now positioned in the mold cavities 23, 24, as indicated by arrows 27.

In FIG. 7 it can be seen that the mold halves 21 and 22 are now closed again, as indicated by arrows 28, whereby a cavity 29 is formed between the labels 10 and 11.

FIG. 8 shows that the cavity 29 can now be filled with the plastic material 12, for example by injecting the plastic material 12 into the cavity from below, in the direction indicated by arrow 30, as illustrated in FIG. 8. Upon completion of the injection process, the smart card 1 is finished and can be removed from the mold, as has been described above with reference to FIGS. 3 and 4.

As has been mentioned before, the module 13 is fastened on the label 10 before the label 10 is positioned in the mold 20. This operation can be effected in numerous different ways that will be described hereafter with reference to FIGS. 9 to 20.

Figure 9:
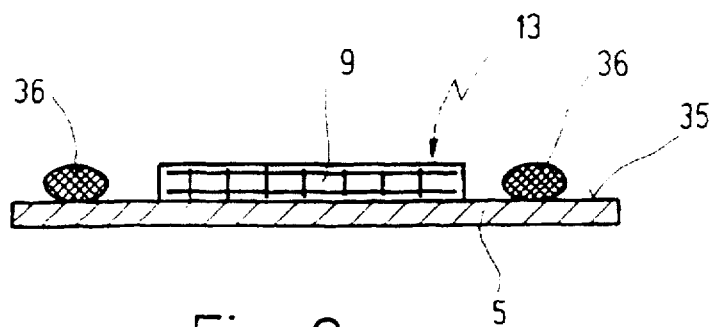
FIG. 9 shows a grossly enlarged side view of a module comprising a chip and a carrier and contact wafer. illustrating a first example of a method for mounting the module on a label that forms one surface of a smart card.

FIG. 9 shows a side view of the carrier and contact wafer 5 with the chip 9 mounted thereon. Now, adhesive patches 36 are applied on one upper face 35 of the wafer 5, next to the chip 9.

Figure 10:
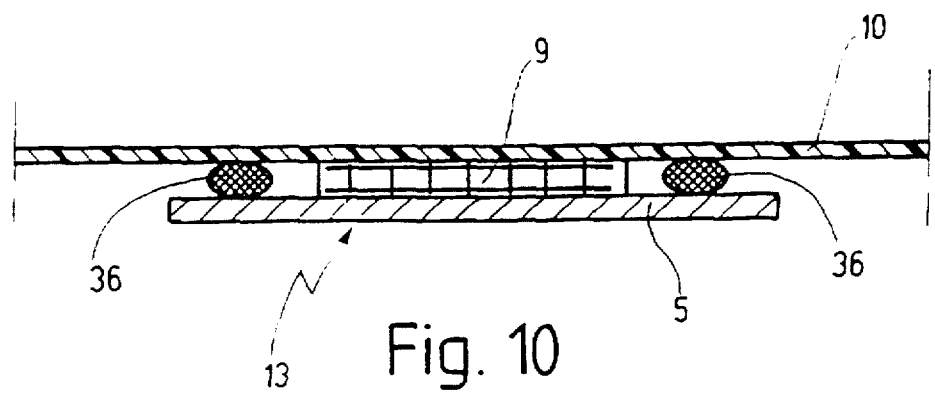
FIG. 10 shows a representation similar to that of FIG. 9. but illustrating a second working step.
Figure 11:
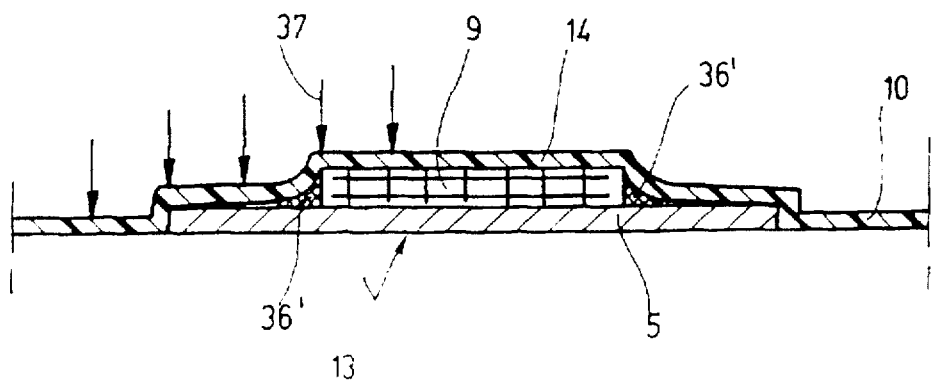
FIG. 11 shows a representation similar to that of FIG. 9. but illustrating a third working step.

From FIG. 10 it is apparent that by a further operation the label 10 is placed on the arrangement according to FIG. 9, or conversely the arrangement according to FIG. 9 may be placed on the label 10.

The bonding effect of the adhesive patches 36 causes the module 13 to adhere to the label 10 so that the label 10 can be positioned in the mold 20 with the module 13 attached to it.

During the injection process, the plastic material 12 exerts a pressure on the label 10, i.e. on its face opposite the module 13. This gives rise to a pressure which is indicated by arrows 37 in FIG. 11. The pressure causes the label 10 to apply itself to the module 13 in the form of the envelope 14; due to the temperatures prevailing during the molding process the label 10 may also undergo a deformation in the manner of a deep-drawing operation. The adhesive patches 36 are plasticized and deformed during the process, as indicated by 36' in FIG. 11. At the end of that process, the module 13 is fixed in its position permanently and positively, and forms a flat surface together with the label 10.

Figure 12:
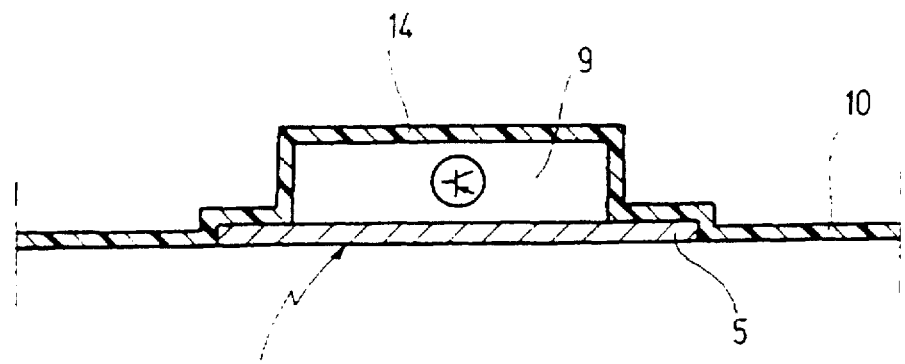
FIG. 12 shows a representation similar to that of FIGS. 9 to 11. but illustrating a second embodiment of a mounting method.

FIG. 12 shows an embodiment of the kind that has been illustrated in principle already in FIG. 2. According to that embodiment, the label 10 and the enclosure 14 are intimately applied around the module 13, it being even possible in this case for the module 13 to be retained in place exclusively by the enclosure 14 surrounding it.

Figure 13:
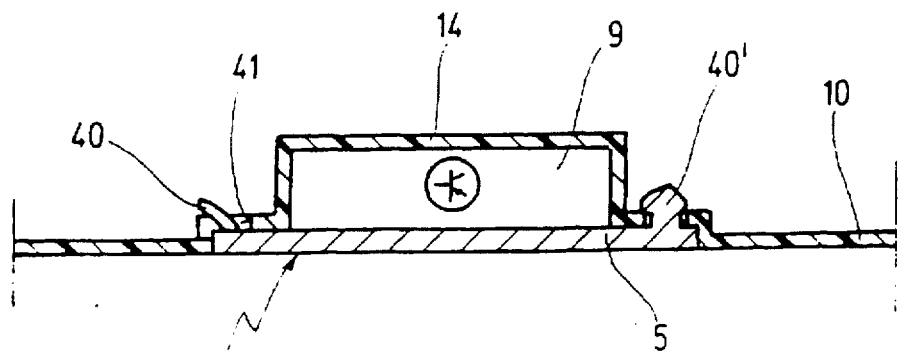
FIG. 13 shows a representation similar to that of FIG. 12. but illustrating two variants of a third embodiment of a mounting method.

In the case of the embodiment illustrated in FIG. 13, a tongue 40, projecting through a corresponding opening 41 in the label 10, is formed in the left half of the wafer 5. The tongue 40 may, for example, be given an elastic design and may lock behind the rear face of the label 10 when engaged in the opening 41. Correspondingly, as illustrated as an alternative in the right half of the Figure, a button 401 may be engaged in a corresponding opening in the label 10 in the manner of a push-button. Both measures contribute toward improving the pull-out strength of the module 13.

Figure 14:
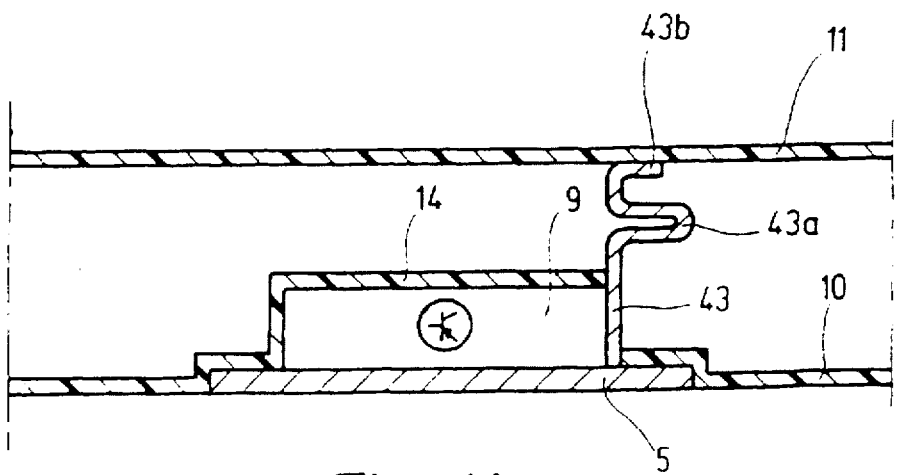
FIG. 14 shows a representation similar to that of FIG. 12. but illustrating a fourth embodiment of a mounting method.

In the case of the embodiment illustrated in FIG. 14 an angle 43, which may for example extend to the opposite label 11, is formed integrally with the wafer 5. The angle 43 comprises a section of spring-like design 43a and a flat section 43b that rests against the label 11.

Figure 15:
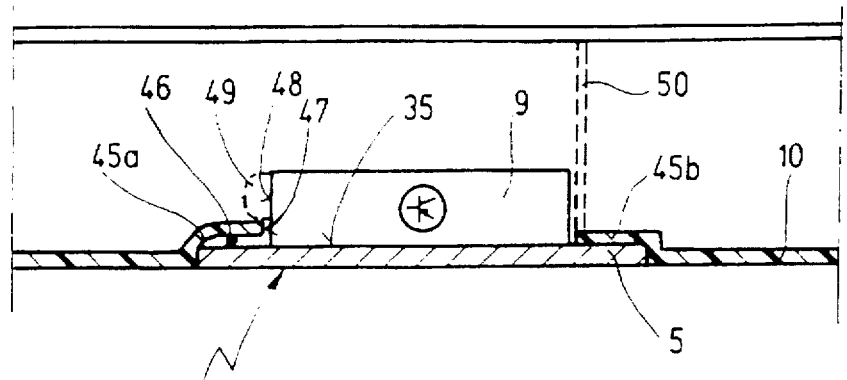
FIG. 15 shows a representation similar to that of FIG. 12. but illustrating three variants of a fifth embodiment of a mounting method.

In the case of the embodiment illustrated in FIG. 15, an opening 47 is provided in the label 10. Overlapping portions 45 of the label 10 extend over the wafer 5 in the marginal area of the opening 47. The overlapping portions 45 may be fixed to the wafer 5 by means of adhesive patches 46, as indicated by 45a in the left half of FIG. 15. In the right half of FIG. 15 it is indicated by 45b that under certain circumstances the mere form fit between the opening 47 and the side 48 of the chip 9 may suffice to retain the module 13 in its position.

In the left half of FIG. 15, a projection 49 can be seen which contributes additionally toward securing the module 13 in its position, projecting elastically through the opening 47. In the right half of FIG. 15 the right overlapping portion 45b of the label 10 has a bent-off portion 50 which, similar to the angle 43 of the variant according to FIG. 14, may extend up to the label 11.

Figure 16:
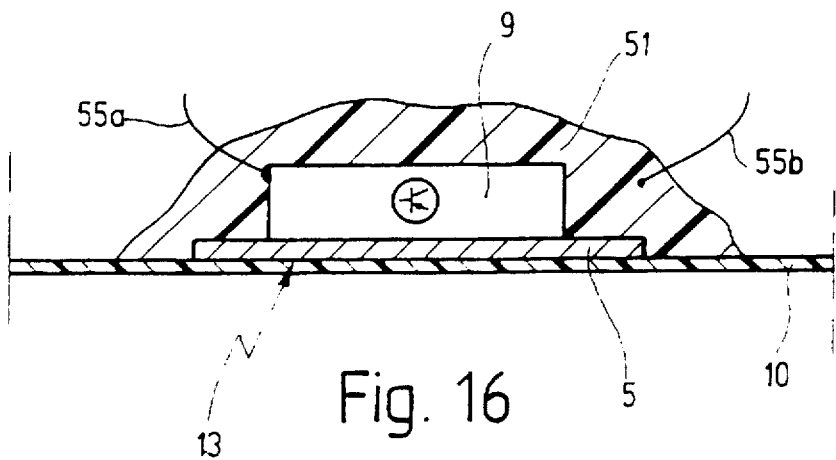
FIG. 16 shows a representation similar to that of FIG. 12. but illustrating a sixth embodiment of a mounting method.

In the case of the further embodiment illustrated in FIG. 16, the module 13 is retained on the label 10 by an embedding compound 51. For this purpose, the module 13 may at first be placed loosely on the label 10, whereafter the embedding compound 51 may be applied around it in such a way that the module 13 is covered at least in part by the embedding compound 51, the latter covering also at least certain sections of the label 10. Preferably, the embedding compound 51 is applied in such a way as to completely cover the module 13, as illustrated in FIG. 16. In the embodiment illustrated in FIG. 16, the module 13 is fastened on the inside of the label 10 by that "soft-mounting" method so that the wafer 5 is not exposed. Consequently, any data exchange can be effected in the case of the illustrated embodiment only by radio, via an antenna that may be either molded into the unit or arranged on the opposite label, as will be described in more detail further below in connection with FIG. 22.

As an alternative to the embodiment illustrated in FIG. 16, it is, however, of course also possible to provide a corresponding opening in the label 10, at the location of the wafer 5, so that the wafer 5 can be used as a contact wafer also when the described "soft-mounting" method is used.

FIG. 16 shows another variant of the invention. In this case, reference numeral 55a designates a first anchoring element fastened to the chip 9, whereas 55b indicates a second anchoring element embedded only in part in the embedding compound 51.

During the injection-molding process, the anchoring elements 55a, 55b bond to the plastic material 12, not shown in FIG. 16, thereby increasing the pull-out strength of the module 13.

Figure 17:
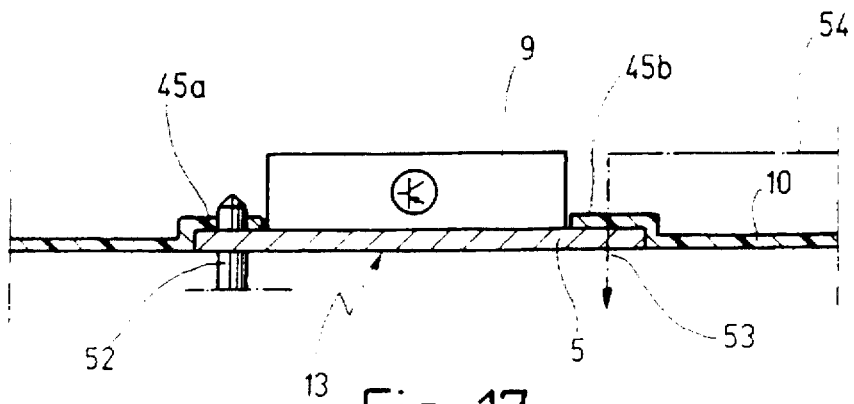
FIG. 17 shows a representation similar to that of FIG. 12. but illustrating a seventh embodiment of a mounting method.

FIG. 17 shows two variants of another embodiment of the invention. In the case of the variant shown in the left half of FIG. 17, a pin 52 extends through a corresponding hole in the wafer 5 and in the left overlapping portion 25a to secure the module 13 in its position in the mold 20. In the case of the variant illustrated in the right half of FIG. 17, a pin 53 of a sunk head 54, indicated only diagrammatically in the drawing, extends through corresponding holes in the right overlapping portion 45b and in the wafer 5. This, too, may assure the proper positioning of the module 13.

In the case of the embodiment illustrated in FIGS. 18 and 19, the label 10 is again provided with an opening which now, however, has the size of the wafer 5. A lateral tongue 56, or a plurality of such tongues, extend over the wafer 5 thereby fixing the module 13 in its position.

In the case of the embodiment shown in the left half of FIG. 20, the envelope 14 is provided with a bulged portion 58 above the chip 9. The bulged portion 58 acts to support the module 13 resiliently against the opposite label 11. During the injection-molding process the bulged portion 58 is then compressed. As can be seen in the right half of that Figure, it is also possible to provide a separate bulged element 58', for example a correspondingly curved piece of metal.

According to the embodiments described above, the labels 10 and 11 were separately prepared and placed in the molds 20 individually, as can be seen best in FIG. 5.

According to an alternative method the label can, however, be joined to a compound structure—which will be described hereafter as "sandwich" —before being introduced into the mold 20.

FIG. 21 shows a first embodiment of such a sandwich 60a. As will be noted, the representation is similar to that of FIG. 12. However, the labels 10 and 11 are connected one with the other by means of one connection element 61, or a plurality of such connection elements, so that the sandwich 60a can be handled as a single unit.

In the case of the variant according to FIG. 22, the connection between the labels 10 and 11 is established by a metallic support 63 that may, for example, be formed integrally with the wafers 5 and may be designed as a spring, analogously to the embodiment of FIG. 14. Advantageously, the metallic support 63 may at the same time serve as a single-wire or multi-wire line for electric signals. The support 63 may engage the label 11 via a spring 64, although a rigid connection is likewise possible. An antenna 65, to which signals are supplied by the chip 9, may be fastened on the spring 64 or the support 63 as such.

In the case of a variant according to FIG. 23, the sandwich 60c is entirely designed as one piece; the labels 10 and 11 are formed by the same film, the labels 10 and 11 being connected via an arc-shaped film section 67. An injection opening 68, through which the plastic material can be injected, may be disposed in the section 67.

Figure 24:
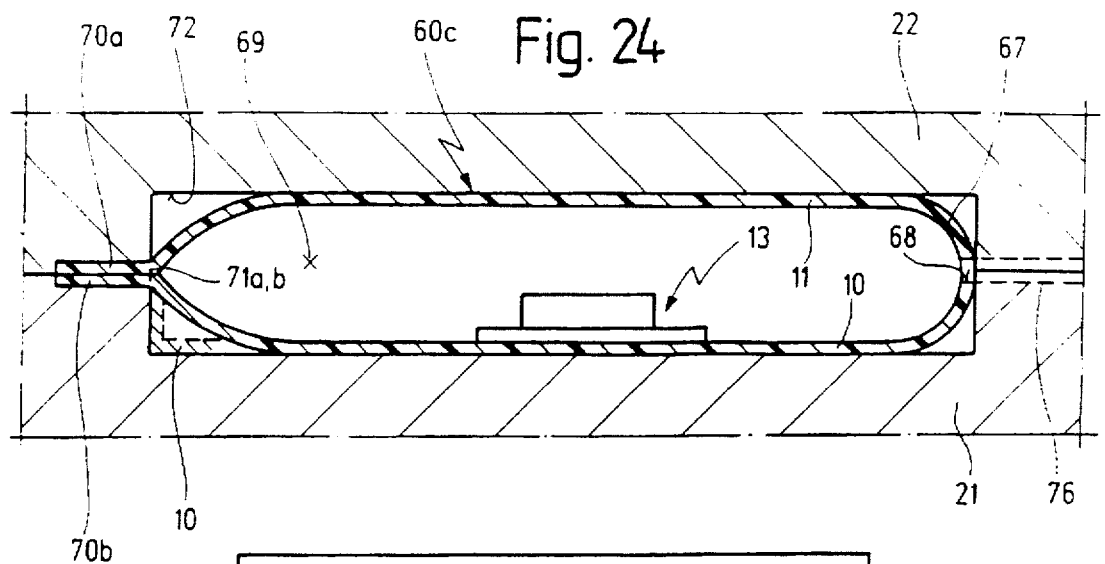
FIG. 24 shows a representation similar to that of FIG. 21. but illustrating a fourth embodiment of a sandwich. by way of a diagrammatic representation of an arrangement inside a plastic injection mold.

FIG. 24 illustrates in this connection the way the sandwich 60c is arranged between the mold halves 21 and 22. The sandwich 60c forms a cavity 69 that is accessible through the injection opening 68.

Regarding the left half of FIG. 24, the labels 10 and 11 terminate by tongues 70a, 70b that are partly separated from the labels 10, 11 by perforations 71a, 71b. These perforations are provided in preparation of the separation of the tongues 70a, 70b from the labels 10, 11 to be effected later. The tongues 70a, 70b are clamped between the mold halves 21, 22 in a position one overlying the other.

The sandwich 60c does not, in the illustrated embodiment, fill the mold cavity 72 completely. But it is of course possible to adapt the mold cavity to the shape of the sandwich, or vice versa, as indicated at 10'.

Figure 25:
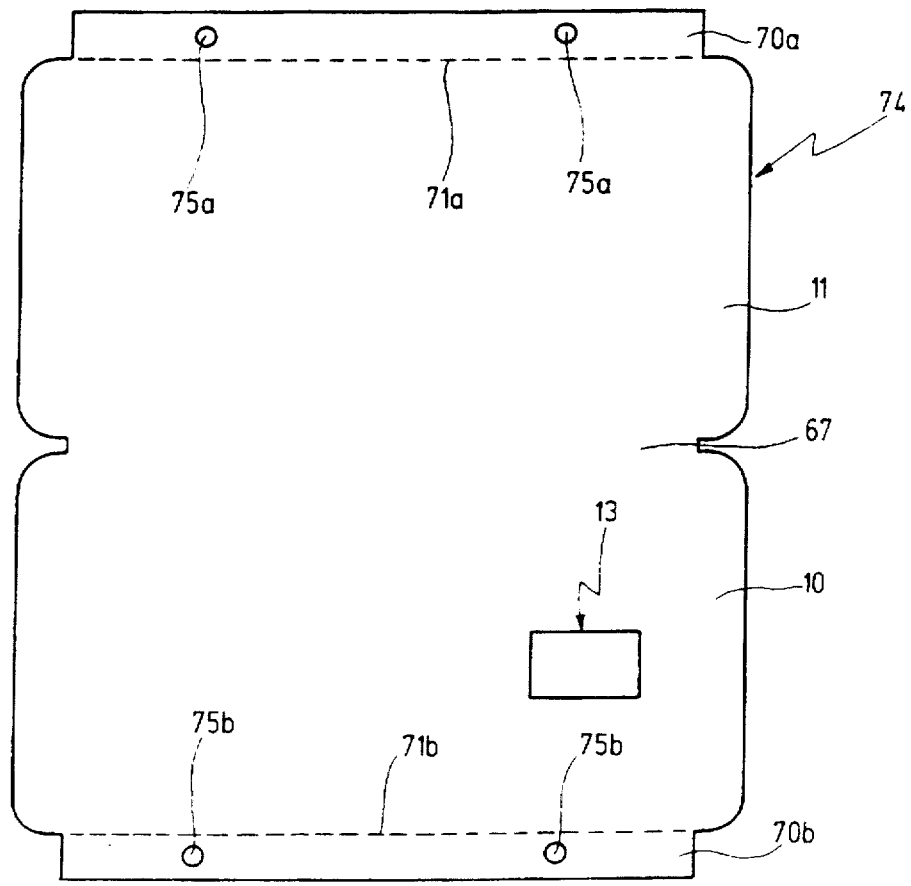
FIG. 25 shows a blank. in reduced scale. for the production of the fourth embodiment of a sandwich according to FIG. 24.

The sandwich 60c is obtained, for example, by folding a blank 74, of which a developed view is shown in FIG. 25 in reduced scale.

It can be seen that register holes 75a, 75b are provided in the blank 74 in the area of the tongues 70a, 70b. These register holes 75a, 75b serve to ensure the proper positioning of the sandwich 60c inside the mold cavity with the aid of associated pins (not shown) formed on the mold halves 21, 22 that engage the register holes 75a, 75b.

A sprue channel 76 is provided on the side of the mold halves 21, 22 opposite the tongues 70a, 70b. The sprue channel 76 ends flush with the injection opening 68.

During the injection process, the plastic material 12 is injected into the cavity 69 of the sandwich 60c through the sprue channel 76 and the injection opening 68. The pressure thereby building up in the cavity 76 causes the perforations 71a, 71b to break so that the mold cavity 72 on the left side of FIG. 24 is completely filled up by the sandwich 60c. On the right side of FIG. 24, the arc-shaped section 67 is extended until the corners of the mold cavity 72 are completely filled at this end, too. It is procured in this way that the tongues 70a, 70b, being needed only for the proper positioning of the sandwich 70c, are cut off so that they can be removed upon removal of the smart card from the mold.

The method of producing the smart card with the aid of a sandwich is illustrated by way of two embodiments in FIGS. 26 to 30:

FIG. 26 shows again the starting situation, where the smart card 1' of the preceding injection-molding operation is still positioned inside the closed mold halves 21, 22.

When the mold halves 21, 22 are opened in the direction indicated by arrows 25a, as shown in FIG. 27, the smart card 1' can be removed as indicated by arrow 25b.

Now, the sandwich 60 can be introduced as one unit, for example from above in the direction indicated by arrow 25c, as shown in FIG. 28. The sandwich 60 may be positioned either on one or on both sides of the mold cavity.

The mold halves 21, 22 can then be closed again, and the injection-molding process can proceed as described before with reference to FIGS. 7 and 8.

For removing the smart card 1' produced during the preceding injection-molding operation, and for inserting the sandwich 60, one and the same inserter arm may be employed. The inserter arm may comprise for this purpose, for example at its front end, a device for removing the finished molded smart card 1' and, immediately behind the latter in the direction of displacement, a device for inserting the sandwich. The inserter arm then enters the space between the mold halves 21, 22 at first only by its front end, for removing the smart card 1', and is then advanced until the section that serves for placing the sandwich in position is located between the mold halves 21, 22. After completion of the inserting operation, the inserter arm is entirely withdrawn from the area between the mold halves 21, 22.

Alternatively, an inserter arm with right/left function may be used, which means that while the finished smart card 1' is removed on its one side, the sandwich is simultaneously placed in position on its other side.

Figure 30:
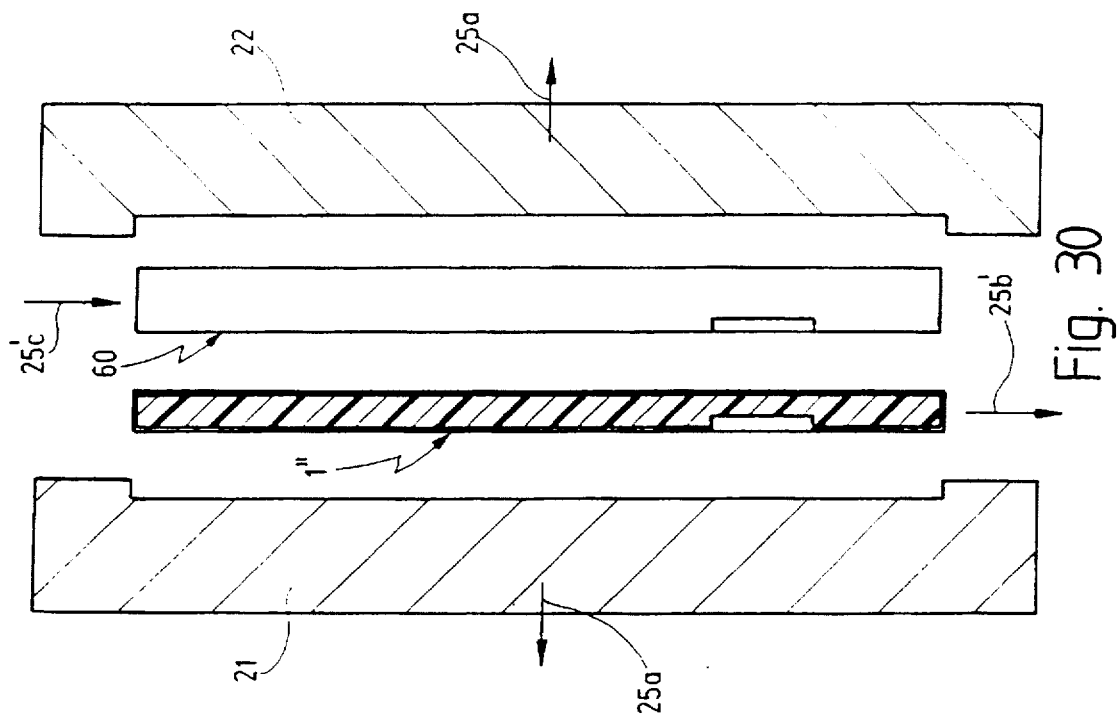
FIG. 30 shows a representation similar to that of FIG. 29. but illustrating a second operating phase of the plastic injection mold.
Figure 29:
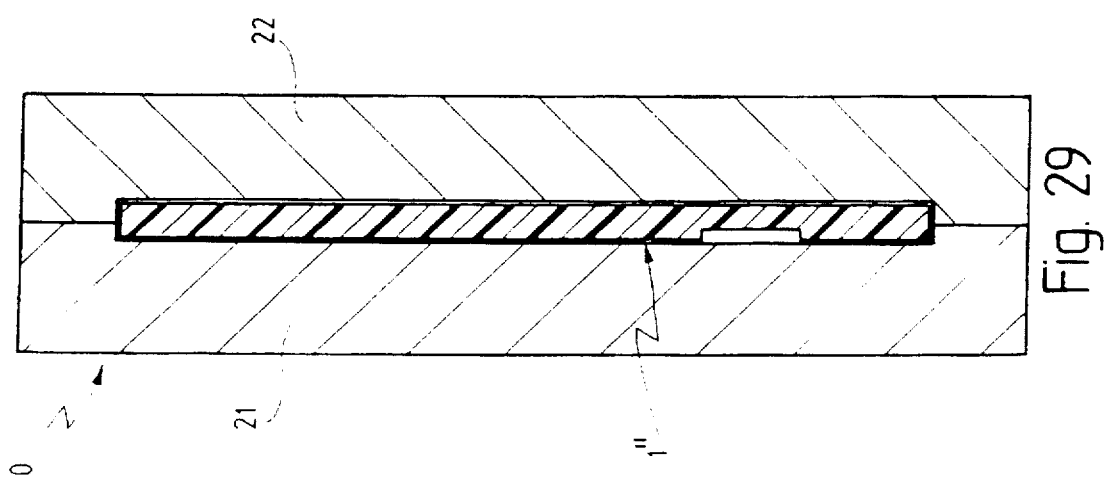
FIG. 29 shows a representation similar to that of FIG. 26. illustrating a variant of such a production method. during a first operating phase of the plastic injection mold.

According to a variant of that method, starting out from the starting position shown in FIG. 29 with closed mold halves 21 and 22, the smart card 1" produced during the preceding cycle can be removed from the mold in the direction indicated by arrow 25b', as shown in FIG. 30, while at the same time the sandwich 16 can be introduced in the direction indicated by arrow 25c', as likewise shown in FIG. 30. By carrying out the withdrawal and insertion processes simultaneously time savings can be achieved.

As has been explained before, it is very important in the injection-molding of smart cards that extremely high surface quality be achieved. It is for this reason that according to conventional production processes the plastic material of smart cards is fed or injected from the side, via slots opening into the narrow side of the smart card.

Figure 31:
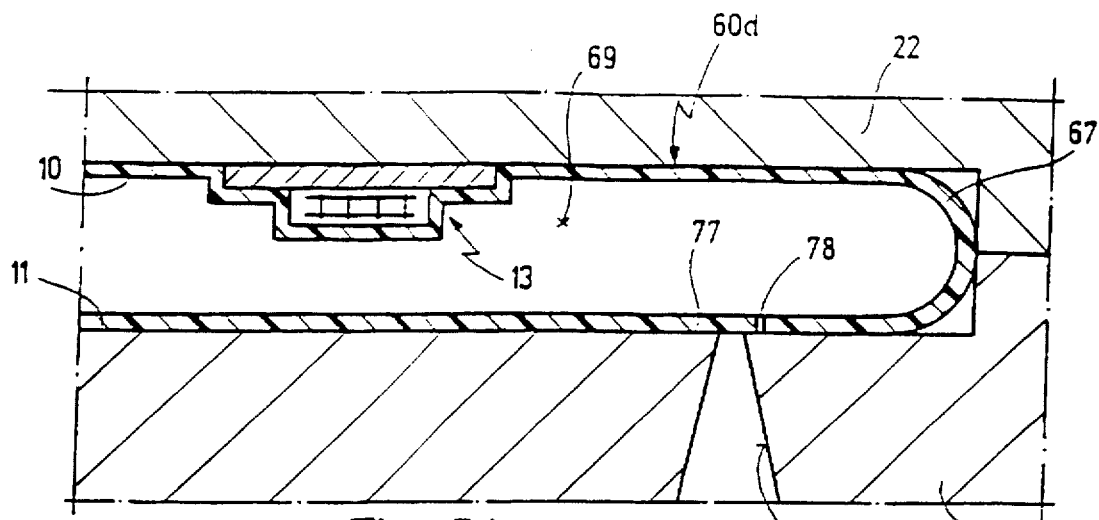
FIG. 31 shows a representation similar to that of FIG. 24. illustrating an injection-molding process employing a special gating technique. during a first working phase.
Figure 32:
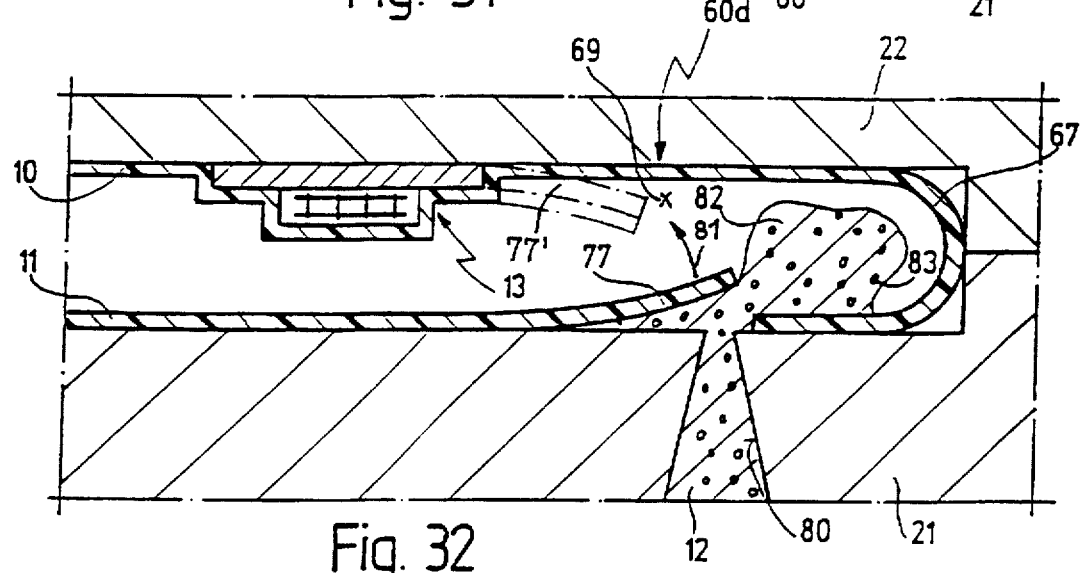
FIG. 32 shows a representation similar to that of FIG. 31, but illustrating a second working phase.
Figure 33:
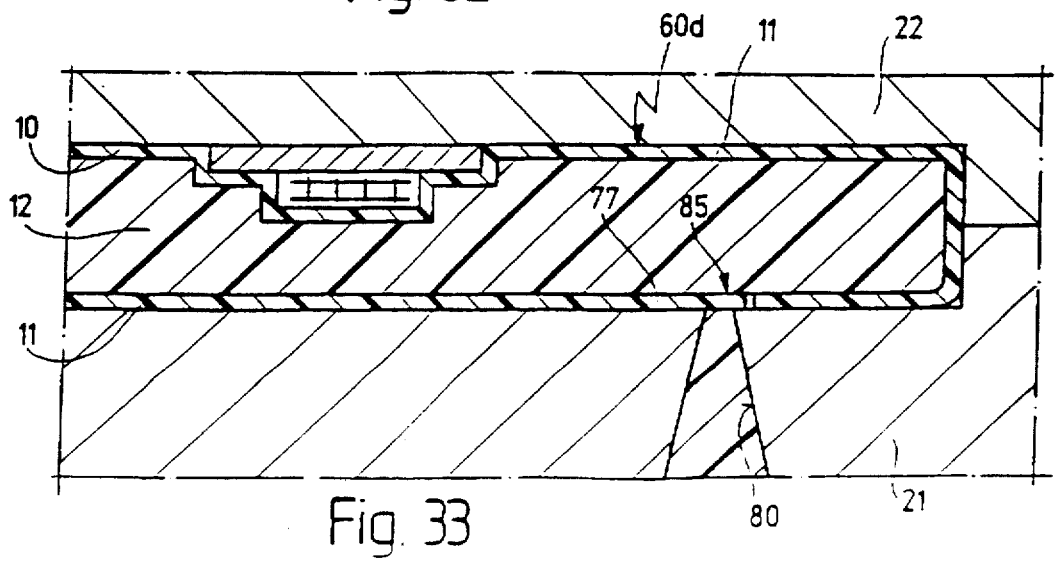
FIG. 33 shows a representation similar to that of FIG. 31, but illustrating a third working phase.

Contrary to that procedure, the plastic material may be injected also through a surface, i.e. the upper surface 2 or the lower surface 3, of the smart card 1 if a method of the kind to be described hereafter by way of FIGS. 31 to 33 is employed:

The illustrated method proceeds, by way of example, from a production method using a sandwich, similar to that described in connection with FIG. 24. The respective sandwich is designated by 60d in FIGS. 31 to 33. The sandwich 60d is provided, in the area of the label 11, with a tongue 77 separated from the surrounding material of the label 11 by a suitably shaped slot 78, as will be described in more detail further below with reference to FIGS. 34 and 35. The tongue may also be configured as part of the module 13, as indicated by reference numeral 77' in FIG. 32.

A feed funnel 80 opens into the mold half 21 below the free end of the tongue 77.

Now, when the plastic material 12 is injected through the feed funnel 80, as shown in FIG. 32, the tongue 77 is bent off in upward direction, as indicated by arrow 81 in FIG. 32. It can be seen at 82 that the plastic material can now enter the cavity 69 of the sandwich 60d. The expansion of the plastic material 12 as well as the flexibility of the card can be supported by a suitable swelling or expanding agent, as indicated by 83 in FIG. 32.

The plastic material 12 or 82 now fills the cavity 69 in its entirety, and an overpressure builds up in the cavity 69, maybe even assisted by the expanding agent 83.

This pressure has the effect, when the cavity 69 is completely filled, to urge the tongue 77 back to its starting position, as indicated by arrow 85 in FIG. 33. The tongue 77 closes the feed funnel 80 so that there does not remain any connection consisting of plastic material 12 in the transition area between the funnel and the filled cavity. The surface of the smart card so produced is perfectly tidy, consisting exclusively of the material of the label 11.

Preferably, the sandwich 60d is sufficiently elastic, or has suitable thermoplastic properties, so that upon completion of the injection-molding process the mold cavity is entirely filled up by the sandwich, as indicated in the right half of FIG. 33.

Figure 34:
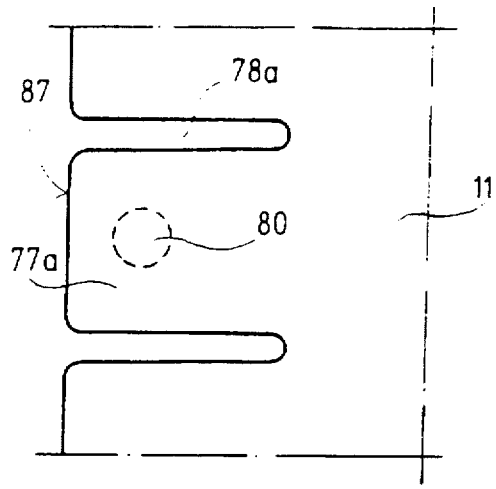
FIG. 34 shows a grossly enlarged top view of a first embodiment of a tongue arrangement for use in connection with the method illustrated in FIGS. 31 to 33.

FIG. 34 shows a first embodiment of the tongue 77a in the label 11. In the example shown in FIG. 34, the tongue 77a borders on an edge 87, i.e. a wall of the mold cavity 72. The slot 78 is therefore configured as two separate slots 78a that delimit the tongue 77b on its two sides.

Figure 35:
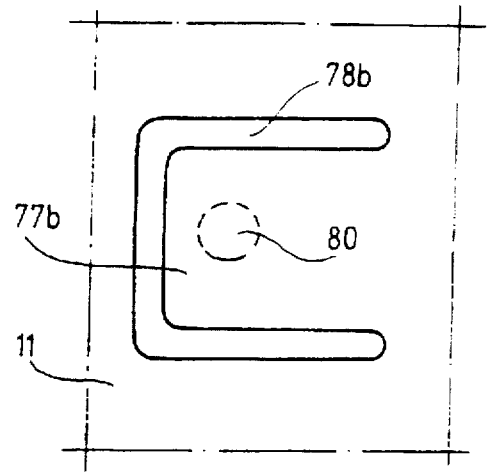
FIG. 35 shows a representation similar to that of FIG. 34, illustrating a second embodiment of such a tongue arrangement.

In the case of the variant according to FIG. 35, the tongue 77b is in contrast located in the middle of the surface of the label 11. The slot 78b therefore exhibits the shape of a U, for example, delimiting the tongue 77b on three sides. It is understood that numerous variants are insofar possible. For example, there is also the possibility to provide two mutually parallel, short slots at a certain distance in the label 11. The area of the label 11 between the two slots then bulges for a short time in inward direction, thus permitting the plastic material to pass laterally through the two slots, and returns to its starting position when the cavity is filled.

Figure 36:
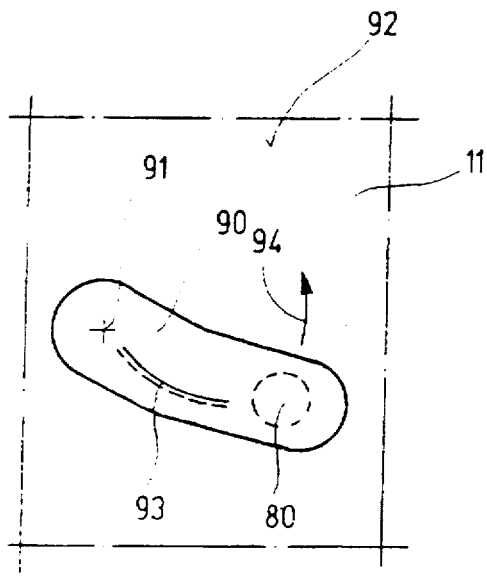
FIG. 36 shows a further representation similar to that of FIG. 34, using a shearing element of the kind used, for example, in connection with the method illustrated in FIGS. 31 to 33, during a first operating phase.
Figure 37:
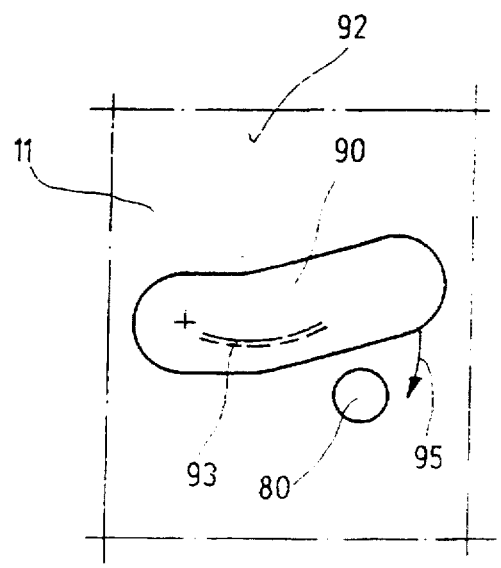
FIG. 37 shows a representation similar to that of FIG. 36, but illustrating a second operating phase.

Another variant intended to achieve the same result is illustrated in FIGS. 36 and 37; here, a shearing element 90 is guided laterally over the opening of the feed funnel 80.

The shearing element 90 can be turned or deformed for this purpose about an axis of rotation 91, indicated diagrammatically in the drawing. The lower face of the shearing element 90 is guided on the upper face 92 of the label 11. When the plastic material enters the plane of the drawing from below, as shown in the representation of FIG. 36, the shearing element 90 pivots in upward direction, as indicated by arrow 94. At the end of the injection-molding process, the shearing element 90 returns to its starting position, as indicated by arrow 95 in FIG. 37.

The deflection of the shearing element 90 is effected by means of a deflection and return element 93. The latter may consist of a bimetal that is deformed under the effect of the heat of the injected plastic material. Or else the element may be constituted by an area with what is known as a "memory effect", or of a suitably designed inclined plane on the lower face of the shearing element 90.

Figure 38:
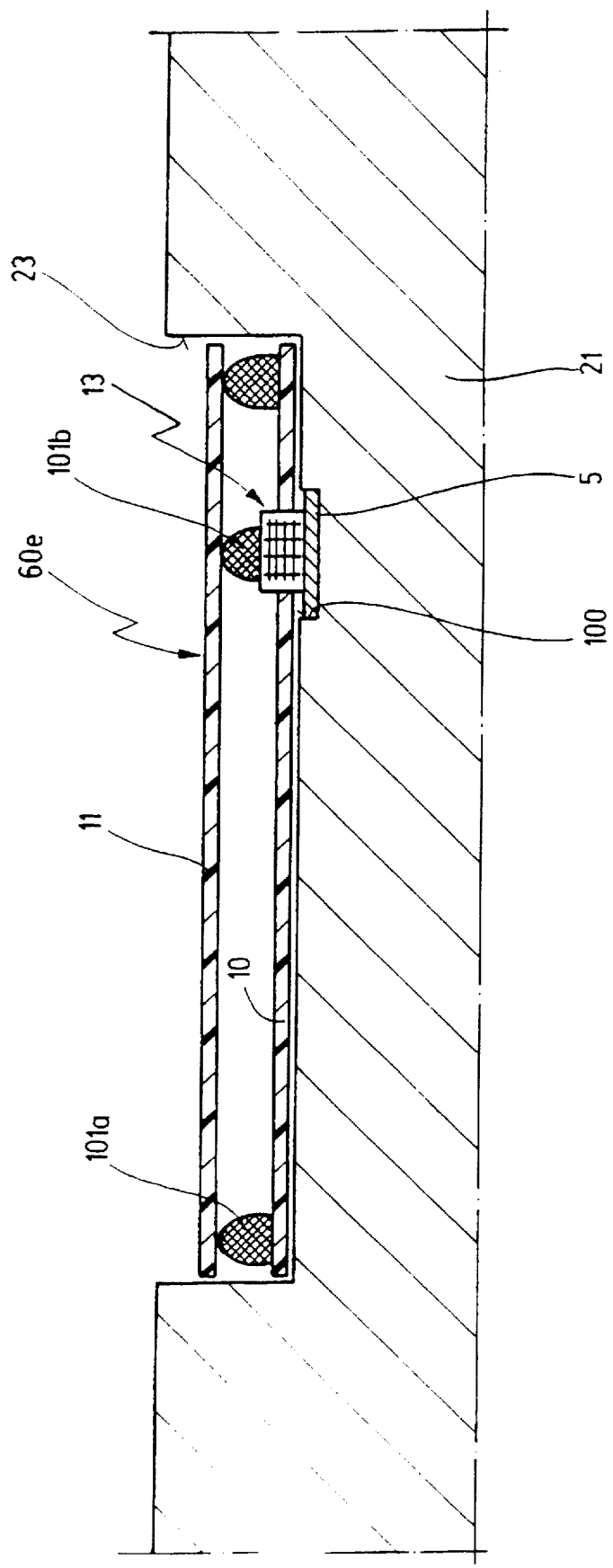
FIG. 38 shows a representation of a fifth embodiment of a sandwich inside a mold cavity.

Finally, the embodiment illustrated in FIG. 38 makes use of a sandwich 60e of the illustrated kind. In the case of that sandwich 60a the labels 10, 11 are connected one with the other by means of adhesive patches 101a and 101b. The adhesive patches 101a are located between the labels 10, 11, while the adhesive patch 101b extends from the module 13 to the opposite label 11.

The sandwich 60e is arranged in the first mold cavity 23 of the first mold half 21. The wafer 5 projects slightly beyond the label 10 in this embodiment. A corresponding recess 100 is provided for this purpose in the first mold cavity 23. The recess 100 has at the same time the function to properly position the entirely arrangement.

It will further be noted that the sandwich 60e does not fill the first mold half 23 in its entirety. The complementary mold not shown in FIG. 38, i.e. the second mold half, projects at this point into the first mold cavity 23 a sufficient length to ensure that the sandwich 60e is closed tight when the mold is in its closed condition. Consequently, the sandwich may be positioned in the one or the other mold half, and may be sized to be smaller or larger than the respective mold cavity, without leaving the scope of the present invention.

I claim:

1. A method for producing smart cards having two flat parallel surfaces, said surfaces being constituted by a first label and a second label, respectively, the method comprising the steps of:

providing, as a separately handleable unit, a sandwich constituted of said first and said second label with said labels being connected one to the other by way of a connection element, said sandwich being substantially identical in outer shape with said smart card and defining a first hollow space between said labels;

providing an injections molding machine having a mold, said mold comprising a first mold half and a second mold half, said mold being adapted to be cyclically opened and closed, respectively, said mold having, further, a cavity defining a second hollow space being essentially identical in outer shape with said smart card, said cavity being accessible when said mold is in an open state;

opening said mold;

inserting said sandwich as one unit into said cavity by means of an inserter arm;

closing said mold;

injecting molten plastic material into said first hollow space;

allowing said plastic material to solidify;

opening said mold; and ejecting said plastic material with said first and said second label thereon constituting said flat parallel surfaces of said smart card.

2. The method of claim 1, wherein a module comprising an integrated semiconductor chip and a carrier-and-contact plate are mounted on one of said labels and, said connection element is configured to electrically connect to said module for transferring electric signal.

3. The method of claim 1, wherein said first and said second labels are formed integrally as one piece and are connected one to the other via an arc-shaped section.

4. The method of claim 3, wherein said first and said second labels are produced from a common blank by folding.

5. The method of claim 4, wherein said blank comprises tongues separated from the remaining blank by perforations, said perforations being broken during injection of said plastic material.

6. The method of claim 5, wherein said tongues are provided with registering holes for affixing said labels in said mold.

7. The method of claim 6, wherein said tongues are positioned outside said cavity when said mold is closed.

8. The method of claim 1, wherein a module comprising an integrated semiconductor chip and a carrier-and-contact plate are mounted on one of said labels.

9. The method of claim 8, wherein said module is affixed to one of said labels in a predetermined position prior to being introduced into said cavity and is then introduced into said cavity together with said label.

10. The method of claim 1, wherein at least one of said labels comprises an image transfer film.

11. The method of claim 1, wherein at least one of said labels comprises a carrier film.

\* \* \* \* \*